US009642273B2

(12) United States Patent
Norman et al.

(10) Patent No.: US 9,642,273 B2
(45) Date of Patent: May 2, 2017

(54) INDUSTRIAL PROCESS FIELD DEVICE WITH HUMIDITY-SEALED ELECTRONICS MODULE

(71) Applicant: Rosemount Inc., Chanhassen, MN (US)

(72) Inventors: Kirsten Nicole Norman, Chanhassen, MN (US); Aaron Andrew Perrault, Shakopee, MN (US); Jason Harold Rud, Mayer, MN (US); Clarence Edward Holmstadt, Chaska, MN (US)

(73) Assignee: Rosemount Inc., Chanhassen, MN (US)

( * ) Notice: Subject to any disclaimer, the term of this patent is extended or adjusted under 35 U.S.C. 154(b) by 609 days.

(21) Appl. No.: 14/036,787

(22) Filed: Sep. 25, 2013

(65) Prior Publication Data
US 2015/0085449 A1 Mar. 26, 2015

(51) Int. Cl.
*H05K 5/06* (2006.01)
*G01D 11/24* (2006.01)
*H05K 7/14* (2006.01)

(52) U.S. Cl.
CPC ........... *H05K 5/069* (2013.01); *G01D 11/245* (2013.01); *H05K 7/1462* (2013.01)

(58) Field of Classification Search
CPC .............................. H05K 5/069; G01D 11/245
USPC .......................................................... 73/431
See application file for complete search history.

(56) References Cited

U.S. PATENT DOCUMENTS

| 3,247,719 A | 4/1966 | Chelner ........................... 73/420 |
| 4,623,266 A | 11/1986 | Kielb |
| 4,958,938 A | 9/1990 | Schwartz ....................... 375/208 |
| 5,353,200 A | 10/1994 | Bodin et al. ................... 361/816 |
| 5,451,939 A | 9/1995 | Price .......................... 340/870.31 |
| 5,483,743 A | 1/1996 | Armogan ......................... 29/883 |
| 5,498,079 A | 3/1996 | Price |
| 5,546,804 A | 8/1996 | Johnson et al. ................ 73/431 |
| 5,606,513 A | 2/1997 | Louwagie ..................... 364/510 |

(Continued)

FOREIGN PATENT DOCUMENTS

| CN | 2170506 Y | 6/1994 |
| CN | 20167398 Y | 6/1994 |

(Continued)

OTHER PUBLICATIONS

Notification of Transmittal of the International Search Report and the Written Opinion of the International Searching Authority for PCT/CN2013/084662, dated Jun. 30, 2014.

(Continued)

*Primary Examiner* — Clayton E Laballe
*Assistant Examiner* — Dennis Hancock
(74) *Attorney, Agent, or Firm* — Westman, Champlin & Koehler, P.A.

(57) ABSTRACT

A field device for use in an industrial process includes a housing having a cavity formed therein. A humidity-sealed electronics module has a first compartment formed therein and is positioned in the cavity. The humidity-sealed electronics module includes a seal board. The seal board separates the first compartment of the humidity sealed electronics module from a second compartment in the housing. A first electrical component in the first compartment is mounted to the seal board and a second electrical component in the second compartment is electrically connected to the first electrical component.

17 Claims, 6 Drawing Sheets

(56) References Cited

U.S. PATENT DOCUMENTS

| | | | |
|---|---|---|---|
| 5,656,782 A * | 8/1997 | Powell, II | G01L 19/14 |
| | | | 73/756 |
| 5,938,619 A | 8/1999 | Dogre Cuevas | 374/141 |
| 5,954,526 A | 9/1999 | Smith | 439/136 |
| 6,062,095 A | 5/2000 | Mulrooney et al. | 73/866.5 |
| 6,146,188 A | 11/2000 | Snyder | |
| 6,356,191 B1 | 3/2002 | Kirkpatrick et al. | |
| 6,484,107 B1 | 11/2002 | Roper et al. | 702/50 |
| 6,546,805 B2 | 4/2003 | Fandrey et al. | 73/753 |
| 6,790,050 B1 | 9/2004 | Roth-Steielow et al. | 439/76.2 |
| 7,164,262 B2 | 1/2007 | Zacay | 324/115 |
| 7,190,053 B2 | 3/2007 | Orth et al. | |
| 7,421,258 B2 | 9/2008 | Bauschke et al. | 455/128 |
| 7,550,826 B2 | 6/2009 | Orth et al. | |
| 8,128,284 B2 | 3/2012 | Martensson | 374/208 |
| 8,217,782 B2 | 7/2012 | Nelson et al. | 340/539.1 |
| 8,223,478 B2 | 7/2012 | Perrault et al. | |
| 8,290,721 B2 | 10/2012 | Wehrs et al. | 702/45 |
| 8,334,788 B2 | 12/2012 | Hausler et al. | 340/870.02 |
| 8,408,787 B2 | 4/2013 | Rud et al. | |
| 8,736,784 B2 | 5/2014 | Hausler et al. | 349/58 |
| 9,030,190 B2 * | 5/2015 | Matt | G01D 11/245 |
| | | | 324/156 |
| 9,097,563 B2 | 8/2015 | Tanabe | |
| 2002/0011115 A1 | 1/2002 | Frick | 73/718 |
| 2002/0069700 A1* | 6/2002 | Dirmeyer | G01D 11/245 |
| | | | 73/431 |
| 2004/0051521 A1* | 3/2004 | Ishihara | G01D 11/24 |
| | | | 324/207.16 |
| 2007/0201192 A1 | 8/2007 | McGuire et al. | 361/600 |
| 2009/0257722 A1 | 10/2009 | Fisher et al. | |
| 2011/0058313 A1 | 3/2011 | Hausler et al. | 361/679.01 |
| 2011/0317390 A1 | 12/2011 | Moser et al. | 361/807 |
| 2012/0063065 A1 | 3/2012 | Perrault et al. | 361/679.01 |
| 2013/0083824 A1 | 4/2013 | Bronczyk et al. | |
| 2013/0344818 A1 | 12/2013 | McGuire et al. | 455/73 |
| 2014/0095095 A1 | 4/2014 | Rud et al. | 702/69 |
| 2014/0269829 A1 | 9/2014 | Bronczyk et al. | 374/152 |

FOREIGN PATENT DOCUMENTS

| | | |
|---|---|---|
| CN | 1155329 A | 7/1997 |
| CN | 1191602 | 8/1998 |
| CN | 1898534 A | 1/2007 |
| CN | 2857251 Y | 1/2007 |
| CN | 201204543 | 3/2009 |
| CN | 101776491 A | 7/2010 |
| CN | 102365528 | 2/2012 |
| CN | 202562633 U | 11/2012 |
| CN | 203053467 | 7/2013 |
| CN | 203148583 | 8/2013 |
| CN | 203 385 492 U | 1/2014 |
| DE | 10 2005 046 331 | 3/2007 |
| DE | 10 2010 030 924 | 12/2011 |
| DE | 10 2010 090 924 | 12/2011 |
| EP | 2 772 729 A2 | 2/2014 |

OTHER PUBLICATIONS

Notification of Transmittal of the International Search Report and the Written Opinion of the International Searching Authority for PCT/US2015*014560, dated May 19, 2015.
Office Action from U.S. Appl. No. 14/225,775, dated Nov. 27, 2015.
Notification of Transmittal of the International Search Report and the Written Opinion of the International Searching Authority for PCT/US2012/043705, dated Apr. 23, 2014.
Office Action from U.S. Appl. No. 13/251,726, dated Apr. 24, 2014.
Notification of Transmittal of the International Search Report and the Written Opinion of the International Searching Authority for PCT/US2014/049710, dated Oct. 28, 2014.
Office Action from Chinese Application No. 201110443913.7, dated Mar. 26, 2014.
Communication Under Rules 161(1) and 126 EPC from European Application No. 12743559.2, dated Jul. 4, 2014.
Office Action from Chinese Application No. 201110443913.7, dated Nov. 4, 2014.
Notification of Transmittal of the International Search Report and the Written Opinion of the International Searching Authority for PCT/US2014/043123, dated Nov. 20, 2014.
Invitation to Pay Additional Fee from corresponding International Patent Application No. PCT/US12/043705 dated May 24, 2013. 9 pgs.
Rosemount "Rosemount 3144P Temperature Transmitter," Mar. 2008.
Office Action dated Mar. 29, 2013 in U.S. Appl. No. 13/251,726, filed Oct. 3, 2011. 13 pages.
Final Office Action dated Nov. 14, 2013 in U.S. Appl. No. 13/251,726, filed Oct. 3, 2011. 15 pgs.
Wika: "Digital Temperature Transmitter," Jul. 2008. 7 pgs.
First Office Action from corresponding Chinese Patent Appln. No. 201120555381.1 dated Jun. 6, 2012. 3 pgs.
Product Data Sheet. Rosemount 644 Temperature Transmitter. Oct. 2010 by Emerson Process Management.28 pgs.
Bulletin IC50A0-E. Temperature Transmitters YTA Series. Yokogawa Electric Corporation. 8 pgs.
Product Data Sheet 3.80. TDZ&THZ Smart HART® Temperature Transmitters. Apr. 2005 by Moore Industries. 16 pgs.
Office Action from U.S. Appl. No. 14/225,775, dated Apr. 12, 2016.
Office Action from U.S. Appl. No. 14/237,476, dated May 31, 2016.
EP Communication from European Patent Application No. 138941604, dated May 9, 2016.
Office Action from U.S. Appl. No. 14/035,019, dated Jun. 21, 2016.
EP Communication from European Patent Application No. 14737130.6, dated May 4, 2016.
Office Action from Chinese Patent Application No. 201410054296.5, dated May 5, 2016.
Office Action from Chinese Patent Application No. 201410186900.X, dated Oct. 19, 2016.
Office Action from Canadian Patent Application No. 2,923,141, dated Dec. 12, 2016.

* cited by examiner

US 9,642,273 B2

INDUSTRIAL PROCESS FIELD DEVICE WITH HUMIDITY-SEALED ELECTRONICS MODULE

BACKGROUND OF THE INVENTION

The present embodiments relate to industrial processes. More specifically, the present embodiments relate to industrial process field devices for use in monitoring or control of industrial processes.

Field devices, such as process variable transmitters and controller, used in industrial processes can be installed in the field on pipelines, tanks and other industrial process equipment. Transmitters sense process variables such as process fluid temperature, pressure, flow, conductivity, pH and others. Other types of industrial process field devices include valves, actuators, field controllers, data displays and communication equipment such as industrial field network bridges.

In many industrial process environments, humidity and moisture are present. The humidity and moisture can enter a housing of the field device and damage or degrade electronic circuitry. In some cases, moisture introduced into the electronic circuitry may affect time-critical electrical communications and may thereby cause drift in measurement or control accuracy. Dendrites may also form, creating unwanted current paths between electrical components. Some electronic components critical to the function of the field device, such as optocouplers or voltage references, are particularly susceptible to humidity.

SUMMARY

A field device for use in an industrial process includes a housing having a cavity formed therein. A humidity-sealed electronics module has a first compartment formed therein and is positioned in the cavity. The humidity-sealed electronics module includes a seal board. The seal board separates the first compartment of the humidity sealed electronics module from a second compartment in the housing. A first electrical component in the first compartment is mounted to the seal board and a second electrical component in the second compartment is electrically connected to the first electrical component.

DETAILED DESCRIPTION

As discussed in the Background section, humidity may enter a field device and interfere with operation of electronic circuitry. In embodiments described below, industrial process field devices that include a humidity-sealed electronics module for "at-risk" electrical components are provided. The sealed module protects the at-risk electrical components from humility or moisture which may enter a housing of the field device.

Figure 1:
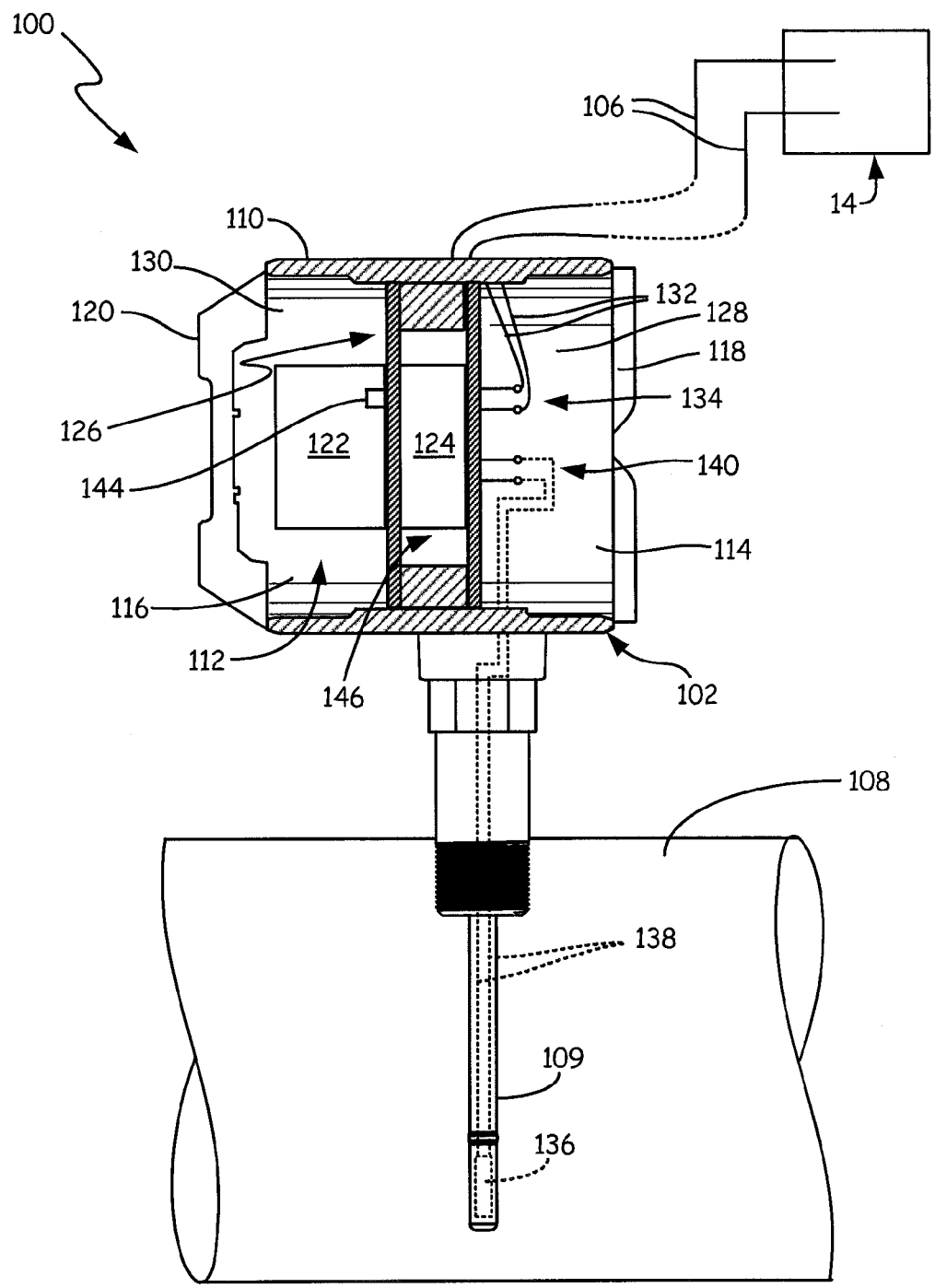
FIG. 1 is an diagrammatic illustration of an industrial process control or monitoring system including a process variable transmitter having a humidity-sealed electronics module in accordance with one embodiment.

FIG. 1 is a simplified diagram showing an industrial process control or monitoring system 100 for use in monitoring or controlling a process fluid in an industrial process. Any number of field devices may be located throughout the process and are used to measure or control a process variable. FIG. 1 includes one such field device, a process variable transmitter 102 which transmits a sensed process variable back to a centrally-located control room 104 in accordance with one embodiment. Various techniques can be used for transmitting the process variable, including both wired and wireless communications. One common wired communication technique uses what is known as a two-wire process control loop 106 in which a single pair of wires is used to carry analog and/or digital information as well as optionally provide power to the transmitter 102. Wireless protocols, such as radio-frequency communication techniques including WirelessHART®, may also be implemented.

Process variable transmitter 102 includes a probe 109 which extends into process piping 108 and is configured to measure a process variable of a process fluid. Example process variables include temperature, pressure, flow, level, pH, conductivity, turbidity, density, concentration, chemical composition, etc. Process variable transmitter 102 includes a housing 110 having a cavity 112 formed therein, which extends between a first opening 114 and a second opening 116. Openings 114 and 116 are cylindrical and can be sealed by respective end caps 118 and 120. Electrical components (circuitry) 122 and 124 are positioned in cavity 112.

As noted above, in many industrial process environments, humidity and moisture are present which may enter the housing of a field device and damage or interfere with operation of circuitry. In some cases, moisture introduced into circuitry may affect time-critical electrical communications causing drift in measurement or control accuracy. In some extreme cases, dendrites may also form, creating unwanted current paths between components.

As shown in FIG. 1, the cavity 112 within the housing 110 includes an internal humidity-sealed container (electronics module) 126 that protects electrical components 124 from humidity and moisture. By placing at-risk electrical components in module 126 product reliability and lifespan are increased. Humidity-sealed container 126 separates cavity 112 into compartments 128 and 130, which can be accessed via openings 114 and 116, respectively. Electrical components 122 and electrical components 124 together form measurement circuitry of transmitter 102. The measurement circuitry 122, 124 is configured to receive a process transmitter variable from a process variable sensor 136 and provide an output. Electrical connection 132 connects to terminals 134 thereby electrically connecting measurement circuitry 122, 124 to loop 106. In one embodiment, sensor 136 comprises a temperature sensor. The temperature sensor 136 can be a temperature resistance device or any other suitable temperature sensor. Leads 138 connect sensor 136 to circuitry 122, 124 through terminals 140. In such embodiments, circuitry 124 can include, for example, a voltage regulator type current source and circuitry 122 can comprise one or more microprocessors and other circuitry configured to carry out voltage measurement, loop communication and control functions. Although FIG. 1 shows a pair of leads 138, any number of leads can be used to couple the sensor 136 to circuitry 122, 124. Further, if device 102 is a controller, reference number 136 can represent a control element used to control a process variable.

In a specific example of an embodiment of the invention, sealed electronics module 126 can carry electrical components that are common across multiple types or configurations of field devices. In such a configuration, a field device can be easily customized by connecting application specific circuitry or component 122 to field device common circuitry or component 124 in module 126. This reduces the amount of customization required to build a field device, decreases manufacturing time, and improves serviceability of the device. For example, measurement circuitry used to measure temperature with an RTD sensor can be carried in module 126. The same module can be used with transmitters having a 4-20 mA output, a HART® output, a local operator output, a WirelessHART® output, etc. The specific communication circuitry can be implemented in electronics 122 and simply connected to module 126 in order to customize the device 100. Further, there are some circuit components that are common between the various circuitry used to implement different communication techniques. This common communication circuitry may also be implemented in module 126. Further, module 126 may include additional (extra) circuitry such that module 126 may be used in multiple configurations. In such an embodiment, some of the circuitry in module 126 may not be used in a particular application. However, this allows a single module design to be used in multiple applications and reduces the amount of customization required when building device 102. FIG. 1 also shows a multi-pin electrical connector or plug 144 can be provided on module 126 for use in electrically connecting electronics 122 to electronics 124.

In another example aspect, the sealed electronics module 126 provides a third compartment 146 within the housing 110 of device 102. In such a configuration, container 126 can be sealed to housing 110 such that compartment 130 is in accordance with intrinsic safety standards. In such a configuration, compartment 128 can be easily accessed by service personal to couple the device 102 to loop 106 or sensor 136. Compartment 130 can contain electronics 122 in accordance with intrinsic safety standards. Compartment 146 provides a third compartment for at-risk components which are protected from humidity and moisture.

Figure 2:
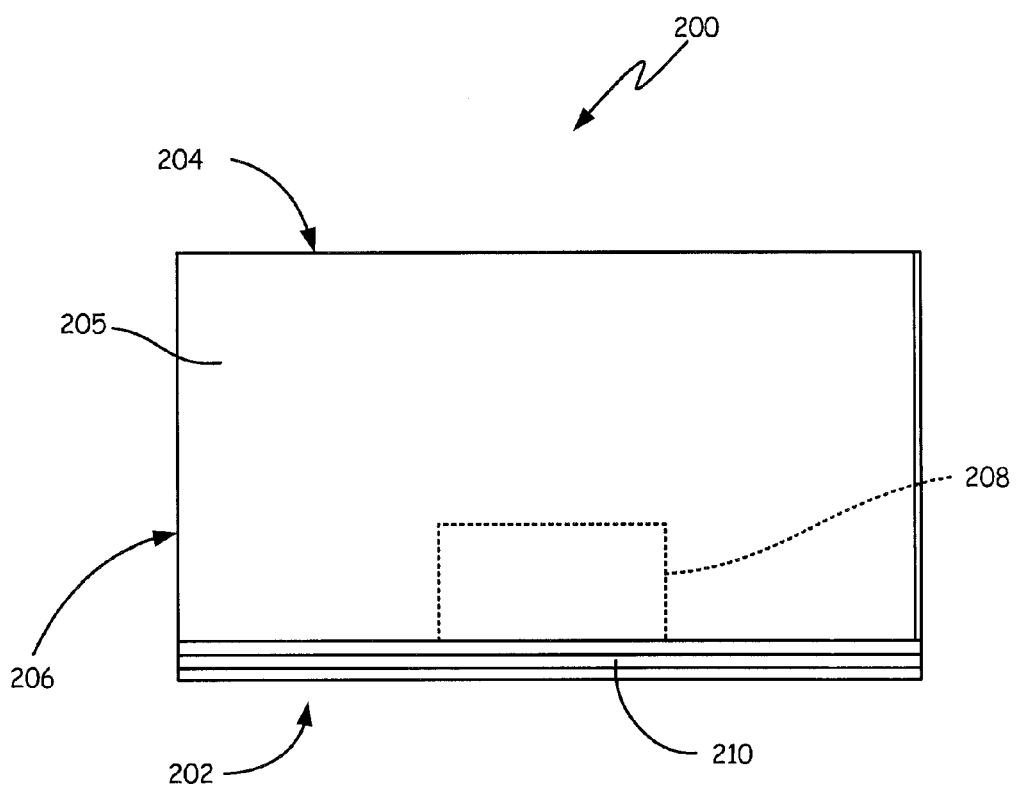
FIG. 2 is a side cross sectional view of a humidity-sealed electronics module in accordance with one embodiment.

FIG. 2 is a cross-sectional illustration of one embodiment of humidity-sealed electronics module 200. Module 200 is cylindrical and configured to fit into a field device housing (such as 110 of FIG. 1). Module 200 includes a bottom 202, a top 204 and side wall 206 that extends there between. An interior 205 of module 200 is hollow and includes one or more electrical components 208.

Top 204 and/or bottom 202 can comprise a seal board (for example, a circuit card or printed wiring board) 210 on which the components 208 are mounted. The seal board(s) may be multi-layered with at least one of the layers formed of a material that prevents humidity from traveling through the seal board(s) 210. The seal board(s) are sealingly coupled to the side walls 206. Details regarding the seal boards, including suitable materials for the seal boards, are provided further below in connection with FIGS. 3 and 4.

Side walls 206 may be formed of a metal or any other suitable material that blocks humidity and moisture from reaching interior 205. In some embodiments, side walls 206 may form a hollow cylinder with open ends that are sealed to the seal board(s) 210. If top 204 does not carry electronics, it may comprise a same or other material as the side walls 206 and may be integrally formed with the side walls 206. In general, module 200 includes at least one seal board 210 and provides a sealed enclosure 205 for electrical component 208.

Figure 3A:
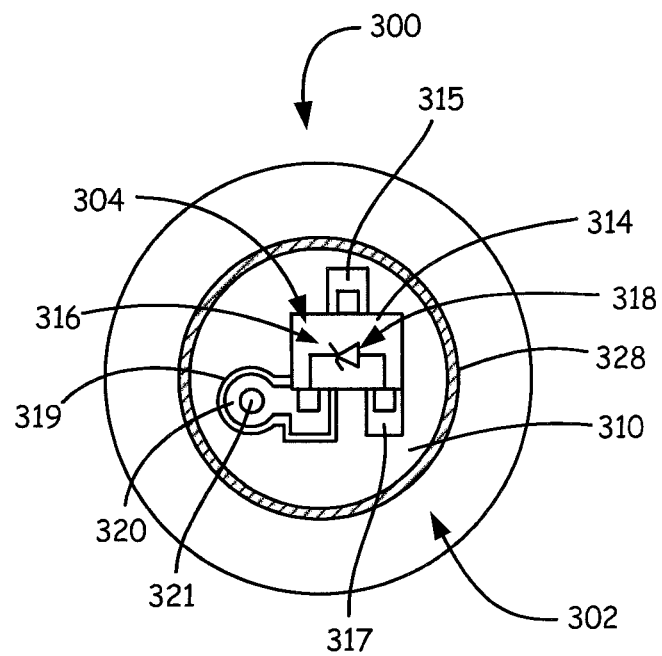
FIG. 3A is a top plan view of one embodiment of a humidity-sealed electronics module.
Figure 3B:
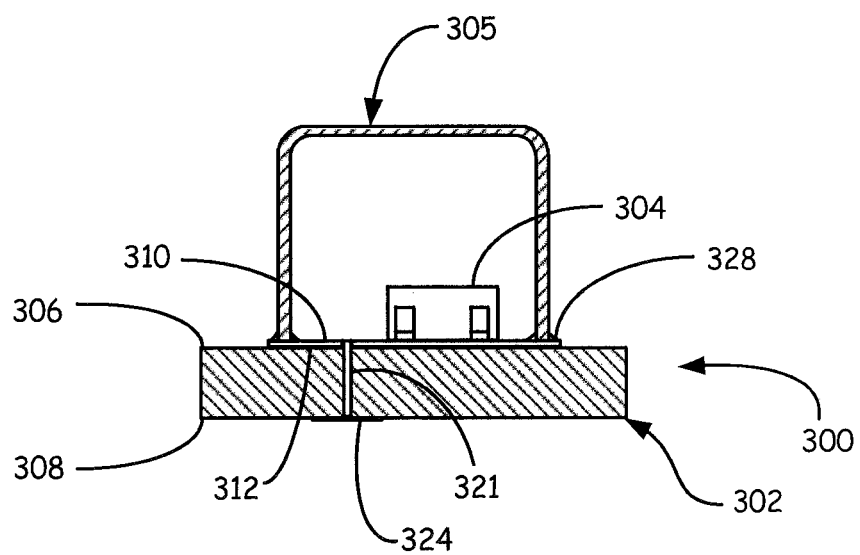
FIG. 3B is a cross-section of the humidity-sealed electronics module of FIG. 3A.

FIGS. 3A and 3B are respective side and top cross sectional views another example embodiment of a humidity sealed electronics module 300 having a single seal board 302. Seal board 302 carries a mounted electrical component 304 sealed by enclosure 305. Component 304 may comprise a low cost component having only minimal sealing, for example in a plastic package. Enclosure 305 may be a metal enclosure for providing a barrier to humidity and moisture. Board 302 is circular or some other shape as desired. Board 302 includes a top surface 306 and a bottom surface 308. In one embodiment, top surface 306 includes a first layer of metal plating 310 such as copper. Top surface 306 can also include a second layer of metal plating 312 such as copper below the first layer 310. Board 302 may include laminates including additional metal layers. A solder mask 314 shown in FIG. 3A is disposed over a portion of layer 310. Regions 315 and 317 are openings in the solder mask 314 and region 319 is an opening in the copper plating 310.

In FIG. 3A, the electrical component 304 is illustrated as a voltage reference comprising a diode having a cathode 316 and an anode 318 which are electrically connected to board 302 at regions 319 and 317, respectively. Anode 318 connects to layer 310. Region 315 is electrically shorted to anode 318 to reduce any openings in the copper plating. Regions 315, 317 and 319 can be soldered to pins of component 304. An isolated trace 320 and via 321 connect the cathode 316 to a solder plug 324 on bottom 308 of board 302 through layer 312. Layer 312 is common with cathode 316 and is of the same shape as and diameter as layer 310. The via 321 is electrically connected to layer 310 thereby blocking any potential leakage through the via 321.

During assembly of the module 300, the component 304 is mounted on board 302 as part of standard production. As part of a second operation, the enclosure 305 is placed over the component 304. The enclosure 305 is then attached with solder 328 around its periphery to the layer 310. The hole in the via 321 is left open during this process to allow for venting of the cavity within the enclosure 305 and to prevent solder from being pulled into the cavity during the soldering process. At a final stage of this process, the cavity is sealed by soldering a plug 324 on bottom surface 308.

It should be noted that the design of the embodiment shown in FIGS. 3A and 3B relies in part on the hermeticity of the board 302 material and copper-to-laminate seal. Selection of laminates of a suitable quality is important to ensure proper humidity sealing. To minimize any potential leakage paths, board laminate to copper surfaces should be substantially maximized and leakage paths to the via hole minimized.

In some embodiments, instead of via 321 being a through-board via, via 321 may be a blind via that is exposed only to the top surface 306 of the board 302 and does not extend to the bottom surface 308. In such embodiments, a hole is added to enclosure 305 for venting during the soldering process. The hole in the enclosure 305 is closed with solder after completion of the process.

Figure 4:
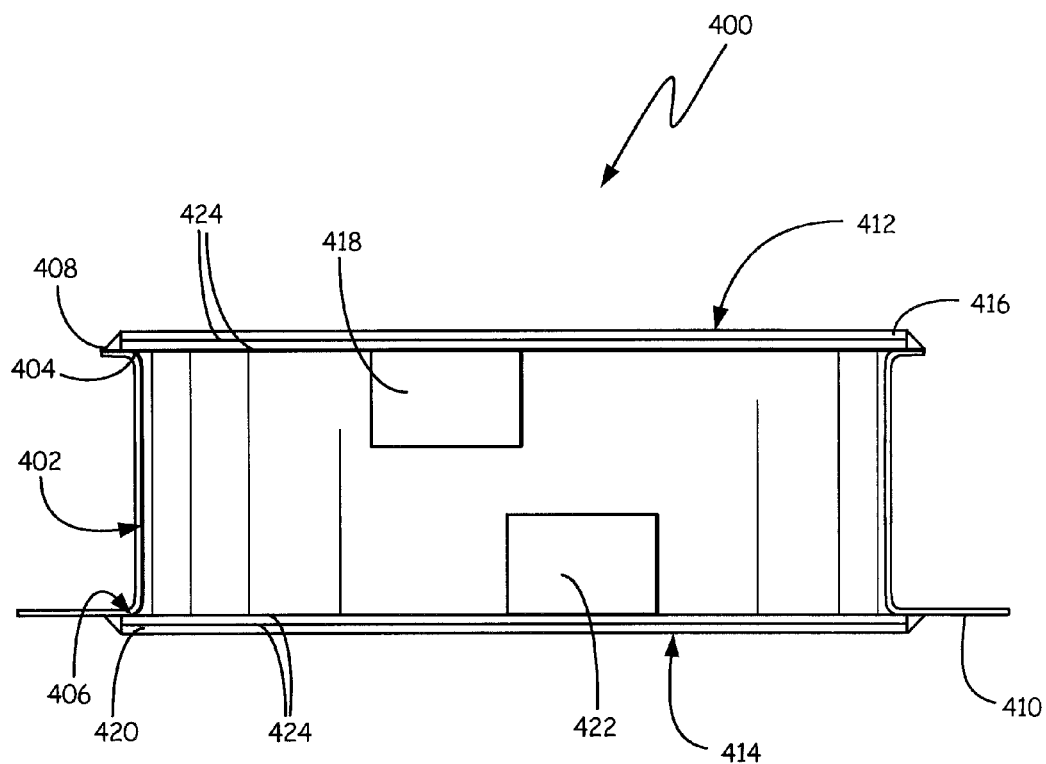
FIG. 4 is a side cross sectional view of a humidity-sealed electronics module in accordance with another embodiment.

FIG. 4 is a cross sectional view of another example embodiment of a humidity-sealed electronics module 400 having two seal boards 416 and 420. Module 400 includes a hollow cylinder 402, which has a top open end 404 and a bottom open end 406 having respective top-end flange 408 and bottom-end flange 410. In some embodiments, cylinder 402 may be constructed from an aluminum alloy and may optionally be coated with tin. Cylinder 402 may also be formed of any other suitable material or combination of materials that provides a barrier to humidity and moisture.

Printed circuit assemblies 412 and 414 are positioned at respective ends 406 and 404 of module 400. Assembly 412 includes seal board 416 and optional electrical component 418. Similarly, assembly 414 includes seal board 420 and optional electrical component 422. In some embodiments, boards 416 and 420 include one or more layers of metal such as copper to block humidity and moisture from entering module 40. In the example embodiment shown in FIG. 4, each board 416 and 420 includes two layers of copper 424. The ends of cylinder 402 are sealed by soldering board 416 and 420 to flanges 408 and 410, respectively. Module 400 is mounted to the housing of the process device along flange 410 as shown in FIG. 6.

Figure 5:
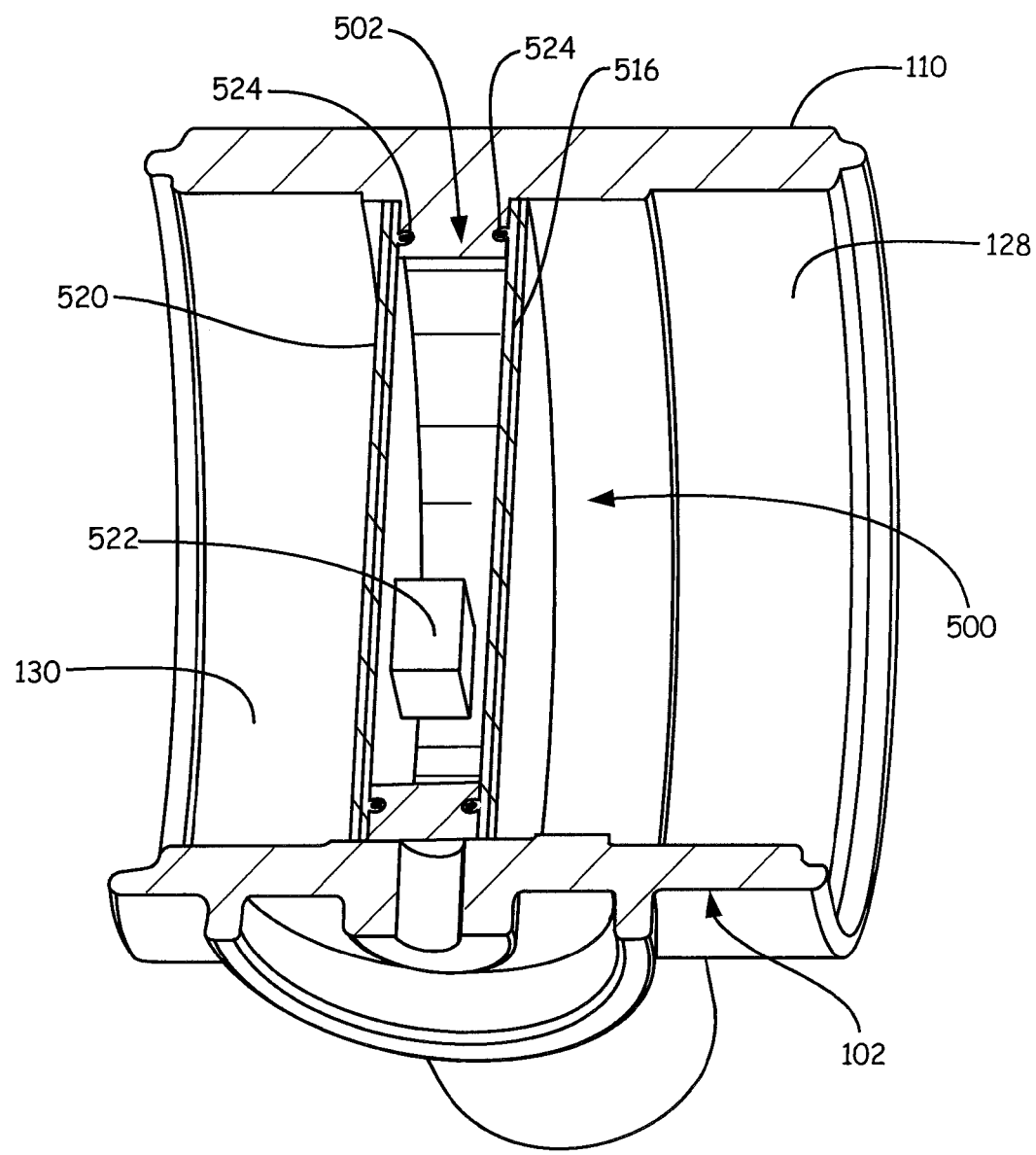
FIG. 5 is a cross-section perspective view of a humidity-sealed electronics module within a field device housing in accordance with another embodiment.

FIG. 5 is a cross-section of a humidity-sealed electronics module 500 in accordance with another example embodiment mounted in housing 110 of device 102. Instead of employing a separate cylinder (such a 402 of FIG. 4), module 500 utilizes housing 110 of device 102. Specifically, an inner cylindrical ring 502 of field device housing 102 as an enclosure for an electrical component such as 522. Seal board 516 and 520 are sealingly coupled to opposite ends of cylindrical ring 502 by solder. Electrical component 522 is mounted to board 520. In another configuration, boards 516, 520 are sealed to housing 110 by O-rings 524 and secured in place by screw, adhesives, or the like. In another example, elements 524 comprises welds or solder that seal boards 516, 520 to ring 502. Module 500 eliminates the need for a separate cylindrical enclosure such as 402 of FIG. 4. In another example configuration, one of elements 516, 520 is an interior bulkhead integrally formed with housing 102.

Figure 6:
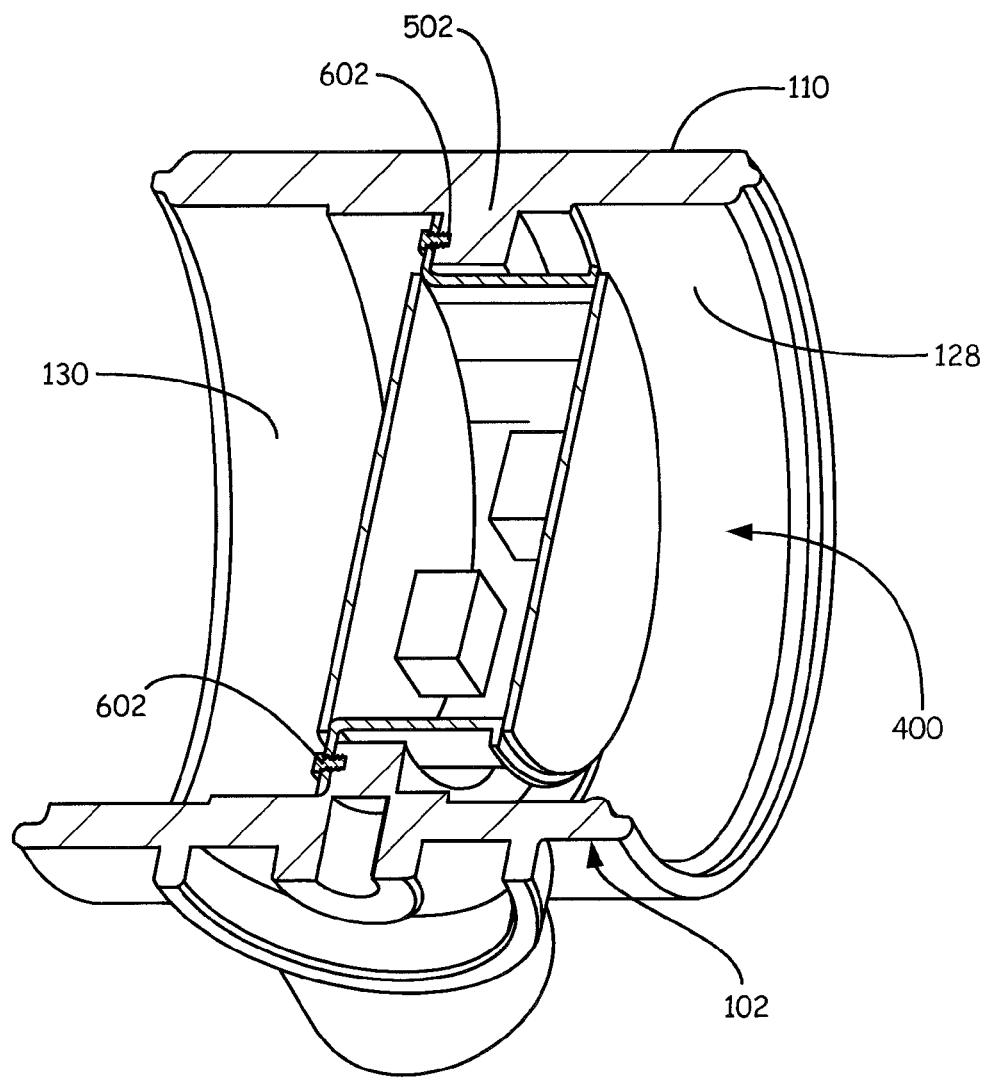
FIG. 6 is a cross-section perspective view of the humidity-sealed electronics module of FIG. 4 mounted within a field device housing.

FIG. 6 is a cross-section of a humidity-sealed electronics module such as 400 of FIG. 4 mounted on cylindrical ring 502 of housing 102. In this embodiment, bottom-end flange 410 of cylinder 402 is coupled to cylindrical ring 502 using multiple fasteners 602, such as screws. Other attachment techniques may be used such as solder, adhesives, or others. An optional O-ring (not shown) may be positioned between bottom-end flange 410 and cylindrical ring 502.

Although the present invention has been described with reference to preferred embodiments, workers skilled in the art will recognize that changes may be made in form and detail without departing from the spirit and scope of the invention. For example, other types of materials or layers may be used to fabricate the humidity sealed module, and the various components can be coupled or sealed together using any appropriate technique. The seals may be formed using techniques other than those specifically set forth herein. Although a process variable transmitter is shown, the field device shown and discussed herein can be any type of field device including a controller, configuration or diagnostic device, communication device, etc.

What is claimed is:

1. A field device for use in an industrial process, comprising:
   a housing having a cavity formed therein;
   a humidity-sealed electronics module having a first compartment formed therein, the humidity-sealed electronics module positioned in the cavity and including a seal board, wherein the seal board separates the first compartment of the humidity sealed electronics module from a second compartment in the housing and forms a seal therebetween;
   a first electrical component in the first compartment mounted to the seal board; and
   a second electrical component in the second compartment electrically connected to the first electrical component;
   wherein the humidity-sealed electronics module divides the housing into the second compartment and a third compartment and the first compartment is sealed with respect to the second and third compartments and the second compartment is further sealed with respect to the third compartment;
   wherein the humidity-sealed electronics module includes a side wall and the seal board is sealed to the sidewall; and
   wherein the humidity-sealed electronics module includes a second seal board sealed to the side wall opposite the seal board.

2. The field device of claim 1, wherein the humidity-sealed electronics module includes the second seal board which carries a third electrical component.

3. The field device of claim 1, wherein the side wall comprises metal.

4. The field device of claim 3, wherein the metal comprises an aluminum alloy.

5. The field device of claim 1, wherein the seal board comprises a multi-layer printed circuit board.

6. The field device of claim 1, wherein the seal board includes at least two metal layers.

7. The field device of claim 1, wherein the at least two metal layers comprise copper.

8. The field device of claim 1, wherein the first electrical component comprises process variable measurement circuitry.

9. The field device of claim 1, wherein the first electrical component comprises a communication circuitry.

10. The field device of claim 1, wherein the second electrical component comprises communication circuitry.

11. The field device of claim 1, wherein the humidity-sealed electronics module includes a flange which amounts to a wall of the housing.

12. The field device of claim 1, wherein the third compartment includes a process control loop connection.

13. The field device of claim 1, wherein the third compartment includes a process variable sensor connection.

14. The field device of claim 1, wherein the seal board is soldered to the side wall.

15. The field device of claim 1, wherein the second compartment is sealed in accordance with intrinsic safety standards.

16. The field device of claim 1, wherein the humidity-sealed electronics module is cylindrical.

17. The field device of claim 1 including an electrical via which electrically couples to the first electrical component and extends through the seal board.

* * * * *